United States Patent [19]

Bottka et al.

[11] 4,403,397
[45] Sep. 13, 1983

[54] METHOD OF MAKING AVALANCHE PHOTODIODES

[75] Inventors: Nicholas Bottka; Marian E. Hills, both of Ridgecrest, Calif.

[73] Assignee: The United States of America as represented by the Secretary of the Navy, Washington, D.C.

[21] Appl. No.: 282,783

[22] Filed: Jul. 13, 1981

[51] Int. Cl.³ .................. H01L 21/76; H01L 27/14; H01L 21/363

[52] U.S. Cl. .................................... 29/572; 29/576 B; 29/576 T; 29/578; 29/591; 148/1.5; 357/30

[58] Field of Search .............. 29/572, 576 B, 576 E, 29/576 T, 578, 583, 589, 590, 591; 148/1.5; 357/29, 30, 64; 156/643, 654, 659.1; 204/192 C, 46 G, 47; 427/88; 430/314

[56] References Cited

U.S. PATENT DOCUMENTS

| | | | |
|---|---|---|---|
| 3,463,925 | 8/1969 | Walker et al. | 250/203 |
| 3,534,231 | 10/1970 | Biard | 250/211 |
| 3,586,542 | 6/1971 | Mac Rae | 148/1.5 |
| 3,824,133 | 7/1974 | D'asaro et al. | 148/1.5 |
| 3,873,428 | 3/1975 | Winters | 204/46 G X |
| 4,025,404 | 5/1977 | Joly et al. | 204/192 C X |
| 4,069,095 | 1/1978 | Lorenze, Jr. et al. | 156/632 |
| 4,076,599 | 2/1978 | Caricchio, Jr. et al. | 204/47 |
| 4,115,150 | 9/1978 | Dyment | 148/1.5 |
| 4,144,540 | 3/1979 | Bottka | 357/30 |
| 4,157,926 | 6/1979 | Schoolar | 29/572 X |
| 4,162,203 | 7/1979 | Eden et al. | 204/38 R |
| 4,218,143 | 8/1980 | Bottka | 357/30 X |

OTHER PUBLICATIONS

Foyt, A. G. et al., "Isolation of Junction Devices in GaAs using Proton Bombardment", in *Solid State Electronics*, vol. 12, pp. 209–214, 1969.

Scholl, F. W. et al., GaAs$_{1-x}$Sb$_x$ 1.06 $\mu$m Avalanche Photodiodes", in *Conference International Electron Devices Meeting (Technical Digest)*, Wash., D.C., 1976.

Munoz, E. et al., "Avalanche Photodetectors for Optical Digital Communications", in Conference 23rd International Congress on Electronics, Rome, Italy, 3–1976, pp. 144–150.

Colclaser, R. A. *Microelectronics: Processing and Device Design*, John Wiley and Sons, Inc., New York, 1980.

*Primary Examiner*—M. J. Andrews
*Assistant Examiner*—Alan E. Schiavelli
*Attorney, Agent, or Firm*—R. F. Beers; W. Thom Skeer; Kenneth G. Pritchard

[57] ABSTRACT

A quadrant avalanche photodiode with large surface areas is made using photolithographic planar technology. The use of proton bombardment creates semi-insulating material around the quadrants. Semi-insulating material prevents cross-talk between quadrants.

The Schottky barrier quadrant detectors were fabricated using GaAs$_{1-x}$Sb$_x$ ternary alloys grown epitaxially on heavily doped GaAs substrates.

7 Claims, 4 Drawing Figures

METHOD OF MAKING AVALANCHE PHOTODIODES

BACKGROUND OF THE INVENTION

1. Field of the Invention

The present invention relates to photodiodes. In particular, it pertains to avalanche photodiodes with large surface areas made with planar technology.

2. Description of the Prior Art

Previous segmented photodetectors, such as quadrant detectors, were made of silicon. Silicon, an indirect gap semiconductor, has a relatively deep penetration depth. The depth varies for different wavelengths. The depth is 200 $\mu$m, for 1.06 $\mu$m light. Photocarriers are generated within a volume equal to the surface area times the penetration depth. Therefore, in multi-element silicon detectors the active areas have to be separated by 100–200 $\mu$m to limit cross-talk. In some infrared target seeker optics, it is necessary to be able to observe images smaller than the element separation of silicon detectors.

Thus, silicon photodetectors require a trade-off between the possibility of losing the image as it moves across the strip separating the quadrants or sectors of the photodetector and losing the image because of cross-talk causing a false tracking signal.

The penetration depth of 1.06 $\mu$m radiation in direct gap semiconductors, such as $GaAs_{1-x}Sb_x$, is 1–5 $\mu$m. If the direct gap semiconductor material exists as an epitaxial layer on a substrate of wider gap energy, then the substrate material can serve as a filter.

SUMMARY OF THE INVENTION

A large area avalanche quadrant photodiode is made with planar technology. An epitaxially grown heterostructure on a semiconductor substrate serves as a self-filtering photodetector. The epitaxial layer side of the heterostructure is cycled through three processes each consisting of applying photoresist, exposing the photoresist through a mask, developing the photoresist, and removing the photoresist. The first mask defines an area to be coated with metallic conductor. The second mask defines the area that serves as the active photodetector area. The third mask provides areas for electrical contacts to the metallic conductor.

Between the second and third cycles described above, the epitaxial side of the photodetector is bombarded with protons. The proton bombardment is limited to areas surrounding the quadrants. The proton bombardment produces semi-insulating volumes of depth sufficient to reach into all regions of the structure in which photocarriers are generated. These semi-insulating volumes eliminate edge breakdown and prevent cross-talk between quadrants.

Ohmic contacts are sputtered on the substrate side of the heterostructure.

DETAILED DESCRIPTION OF THE INVENTION

Layers are grown epitaxially on a semiconductor substrate. The substrate can be Sn doped GaAs with a carrier concentration, $N_D$. $N_D$ can be $10^{18}$ cm$^{-3}$. The epitaxial layers can be $GaAs_{1-x}Sb_x$ where x equals the mole fraction of GaSb.

In order to prevent cross-talk between quadrants, the depth of the volume of semi-insulating material separating the quadrants must be greater than the penetration depth of the light. The semi-insulating materials produced by proton bombardment usually do not exceed 10 $\mu$m in depth. Since the penetration depth of 1.06 $\mu$m light in $GaAs_{1-x}Sb_x$ is 1–5 $\mu$m, while the corresponding value for Si is 200 $\mu$m, cross-talk between quadrants in Si detectors can not be prevented using proton bombardment.

The sample is first dipped in photoresist to coat both sides. It is then pulled from the photoresist. A pulling rate of approximately 1.75 cm/min is acceptable for a positive photoresist such as Shipley AZ1350J photoresist. Kodak 747 may also be used at this rate.

The sample is air dried for at least ten minutes. The sample is then baked in a circulating air oven at 100° C. for an additional ten minutes. Alternative drying and baking procedures can be used. The listed ones are exemplary.

Figure 1:
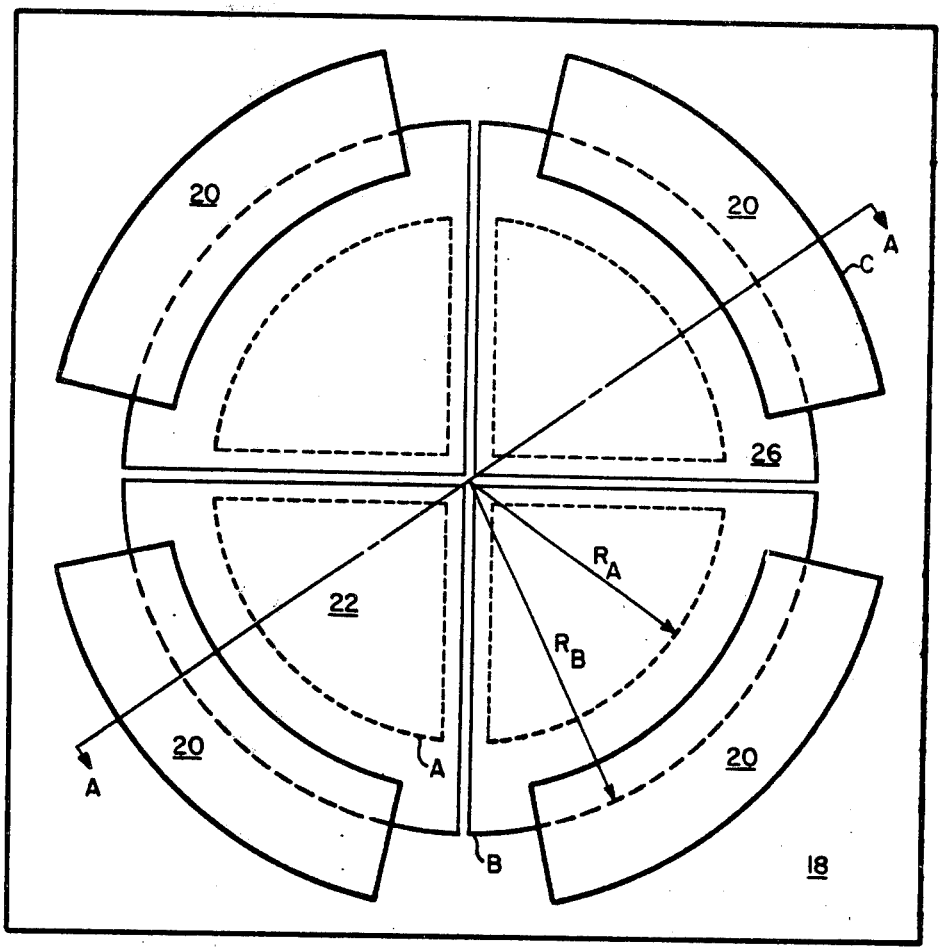
FIG. 1 shows a superposition of the areas defined by the three masks.
Figure 3:
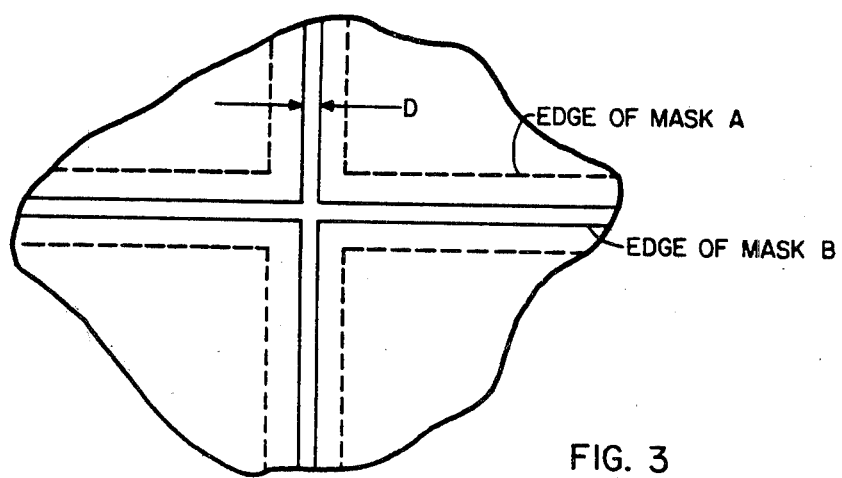
FIG. 3 is an enlarged view of the center area in FIG. 1.

The photoresist covering the epitaxial layer side of the sample is exposed through a Mask B, FIG. 1. The exposing light has a preselected wavelength $\lambda$ and a preselected exposure time, t, for example 30 seconds. Mask B is shown divided into four quadrants. Any number of segments can be used. The circular shape is an arbitrary choice. As shown in FIG. 1, Mask B has radius $R_B$, identified by quadrant areas 26, and the quadrants are separated by width D as shown in FIG. 3.

The exposed photoresist is then developed. Developing for 60 seconds in a 5:1 mixture of water and Shipley AZ 351 is one method of developing the photoresist. The developed photoresist is then post-baked for thirty minutes at 100° C. The sample is then etched. This can be done with a 1:1 solution of HCl:H$_2$O. The sample can be dipped in the solution for one to two minutes and then rinsed with deionized water.

The sample is now mounted on an electroplating apparatus. A conductive surface, such as palladium, is plated on the exposed $GaAs_{1-x}Sb_x$. The area that was exposed through Mask B is now covered with palladium, area 26 in FIG. 1. After electroplating, the sample is rinsed in H$_2$O. The unexposed photoresist is removed with acetone, followed by alcohol and deionized water rinses.

A layer of photoresist is now applied to the entire wafer. This layer can also be formed by dipping the sample in Shipley AZ 1350J photoresist and then withdrawing it at approximately 15.7 cm/min. A thick layer of photoresist, at least 4 $\mu$m thick, is obtained. The layer is dried and baked in a manner similar to that previously described.

The layer is now exposed through Mask A. Once again, a preselected wavelength and a preselected time period are used. As shown in FIG. 1, Mask A is not identical to Mask B. For this particular example, Mask A is the negative of Mask B and the radius, $R_A$, is less than $R_B$. FIG. 3 shows the detail of the center of Masks A and B.

The exposed photoresist layer is then developed as previously described. The development stage is again followed by baking for thirty minutes at 100° C. After these steps, quadrants of photoresist cover nearly all the area covered by palladium. The wafer is now bombarded with 400 Kev protons to produce semi-insulating material beneath all the area not covered by photoresist, and leaving palladium Schottky barriers 22. After bombardment the photoresist is removed.

The sample is again dipped into and pulled from the photoresist. Shipley AZ1350J or Kodak 747 photoresist can be used at a pulling rate of 2.5 cm/min. This layer is air-dried and baked as described previously. If Kodak 747 photoresist is used, the baking step is changed to 70° C. for twenty minutes. Different photoresists have different developing parameters.

The layer is then exposed through a Mask C to yield segments 20 of FIG. 1. There is one segment for each quadrant. Exposure at a selected wavelength for 20 seconds is usually adequate.

The exposed layer is then developed and baked as previously described. The exposed segments are then etched to allow for better electrical contact to the sample. Etching in 1:1, HCl:H$_2$O for one minute is sufficient. Electrical contacts are then electroplated on the etched areas. Thick gold pads are electroplated at 55°-60° C. After electroplating, the sample is throughly rinsed with deionized water. The undeveloped photoresist is then removed by plasma etching in O$_2$ at 1.5 torr for twenty minutes.

Figure 2:
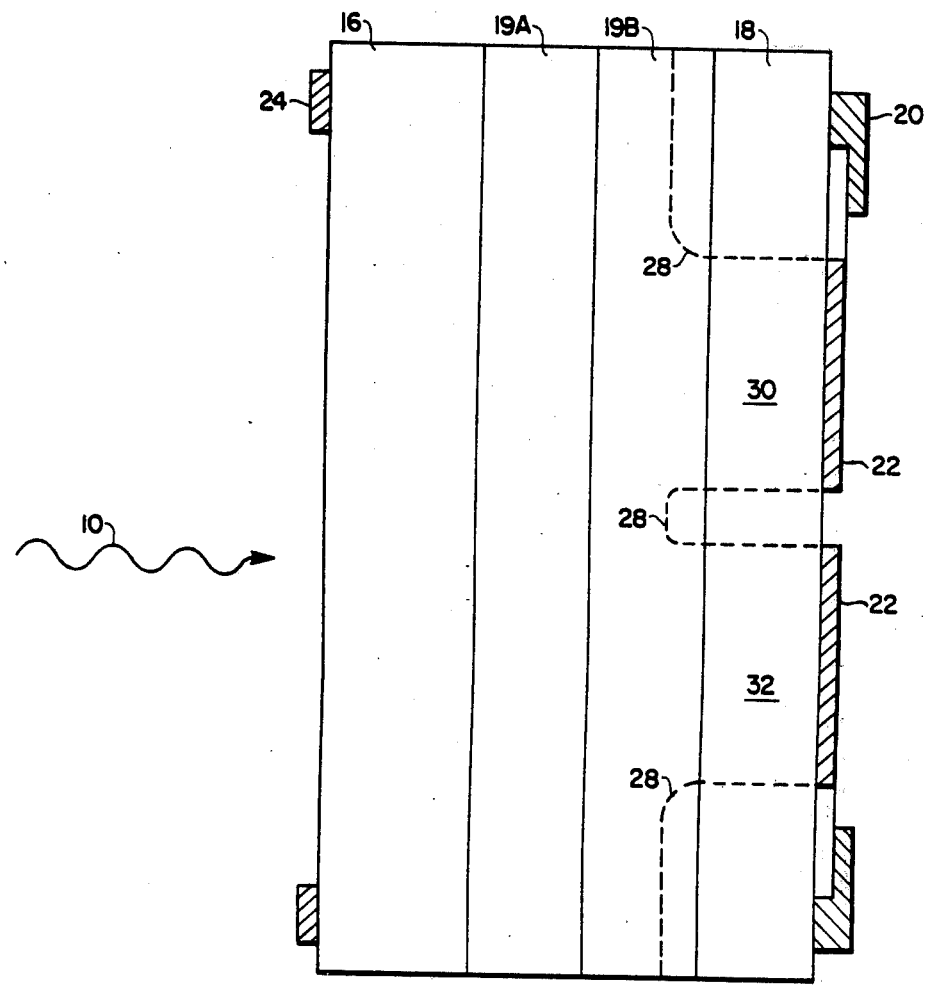
FIG. 2 shows a cross-section of the invention along line A—A of FIG. 1.

Substrate 16, FIG. 2, is sputter etched, and ohmic contacts 24 are sputtered onto substrate 16 through a metal mask, not shown. Satisfactory ohmic contacts 24 are obtained using a 12% Ge-88% Au target. The edges of the sample are then removed to reduce leakage current. They are removed by cleaving.

The finished sample is then mounted substrate side down in a standard TO can, not shown, which has a hole in the center. The epoxy mounting provides electrical contact to ohmic contacts 24. Gold wires are then bonded to the gold segments 20 of FIG. 2. Either thermal or compression bonding can be used.

Incident light 10 passes through an opening in the TO can and strikes substrate 16. Light 10 is filtered by substrate 16 and lattice matching layers 19A and 19B. As many lattice matching layers as desired can be used. Lattice matching layers 19A and 19B have a wider energy gap than epitaxial layer 18, which is the active region absorbing the specific monochromatic wavelength. Upon absorption of light 10 in the active layer 18, photo carriers are generated. The carriers are collected by the palladium electrode. Layers 18 and 19 are not drawn to scale. Substrate 16 is thicker than the entire epitaxial stack, layers 18 and 19. A photocurrent is induced in the circuit comprised of the heterostructure, the palladium Schottky barrier 22, the ohmic contacts 24, and a current amplifier not shown. Dashed lines 28 define the proton bombarded volumes. A photocarrier generated in section 30 can not cross volumes 28 and appear in an other quadrant section 32.

Figure 4:
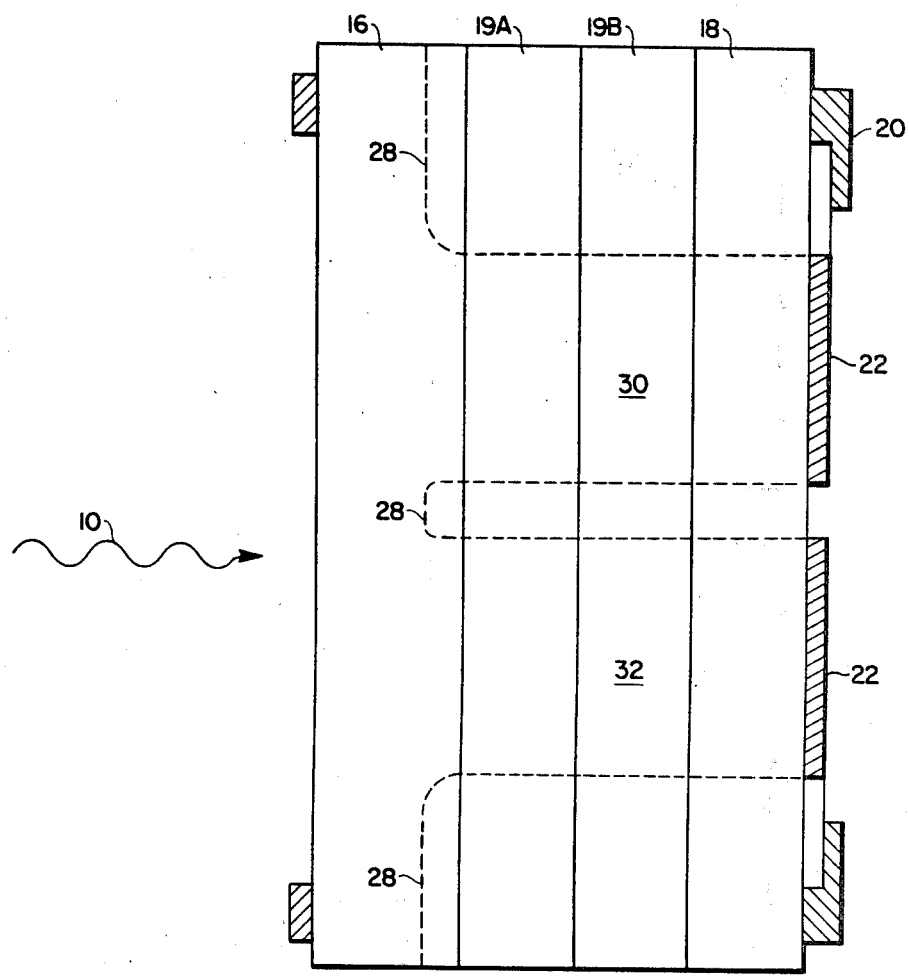
FIG. 4 shows a cross-section similar to FIG. 2 that is suitable for polychromatic light.

FIG. 4 shows a modification of the device for polychromatic light. If polychromatic light is incident on the device, then absorption in lattice matching layers 19A and 19B may occur. As shown in FIG. 2, photocarriers in lattice matching layers 19A and 19B can drift laterally, this can result in cross-talk. To prevent this, proton bombarded volumes delineated by lines 28 must reach into substrate 16. Photocarriers generated by absorption in substrate 16 occur near the surface. The thickness of substrate 16 keeps them from reaching the epitaxial layers.

What is claimed is:

1. A method of making avalanche photodiode segmented detectors with at least one active layer from an epitaxially grown heterostructure sample of GaAs$_{1-x}$Sb$_x$ epitaxially grown on an Sn doped GaAs substrate comprising the steps of:
    (a) applying a photoresist solution to coat both sides of the sample;
    (b) exposing at a preselected wavelength, the sample's active layer through a first mask to open a plurality of windows on said sample;
    (c) etching the sample;
    (d) plating a conductive material over said plurality of windows on said active layer;
    (e) applying a layer of photoresist on the epilayer side of the sample;
    (f) exposing said epilayer side applied layer through a second mask at a preselected wavelength, said second mask having different dimensions than said first mask;
    (g) bombarding said epilayer side of said sample with protons to produce semi-insulating volumes on said epilayer side where photoresist does not cover said epilayer side surface;
    (h) removing said unexposed layer of photoresist such that no photoresist remains on the sample;
    (i) applying a layer of photoresist to coat both sides of the sample;
    (j) exposing the epilayer side of photoresist through a third mask at a preselected wavelength;
    (k) etching said sample;
    (l) depositing electrode contacts on the conductive material on said epilayer side of said sample;
    (m) plasma-etching away said undeveloped photoresist with O$_2$;
    (n) depositing ohmic contacts on preselected portions of the substrate side of said sample;
    (o) cleaving the edges of said sample to reduce leakage current;
    (p) mounting said sample; and
    (q) making electrical contacts to said deposited ohmic contacts and said deposited electrode contacts.

2. A method of making avalanche photodiodes as described in claim 1 where said applying step (a) further comprises using positive photoresist which is dip-pulled at a rate of approximately 1.75 cm/min.

3. A method of making avalanche photodiodes as described in claim 1 where said applying step (e) further comprises dip-pulling the sample in positive photoresist at a rate of approximately 15.7 cm/min to get a layer of photoresist at least 4 μm thick.

4. A method of making avalanche photodiodes as described in claim 1 where said etching steps, (c) and (k), comprise using an etchant of 1:1, HCl:H$_2$O which is applied for 1-2 minutes and then rinsed with water.

5. A method of making avalanche photodiodes as described in claim 1 where said deposited electrode contacts, step (l), comprises electroplating gold pads.

6. A method of making avalanche photodiodes as described in claim 1 where said deposited ohmic contacts, step (n), comprises sputtering Au-Ge(12%) for said ohmic contacts.

7. A method of making avalanche photodiode segmented detectors comprising the steps of:

(a) epitaxially growing several $GaAs_{1-x}Sb_x$ layers on an Sn doped GaAs substrate, where x = the mole fraction of GaSb;

(b) dip-pulling said substrate and layers in positive photoresist so as to coat both sides of the sample;

(c) exposing said sample's outermost layer through a first mask, said exposure at a selected wavelength for a limited amount of time;

(d) etching the sample in a solution of 1:1 $HCl:H_2O$ for one-to-two minutes;

(e) plating palladium layers to form quadrants, said layer plated to a depth of 100–200 Å;

(f) dip-pulling a layer of photoresist on the sample to obtain a layer of photoresist approximately 4 μm thick;

(g) exposing said layer of photoresist through a second mask at a selected wavelength for a limited amount of time, said second mask having different dimensions than said first mask;

(h) bombarding the epitaxial layer side of said sample with protons to produce semi-insulating volumes around each quadrant;

(i) dip-pulling a layer of photoresist on the sample;

(j) etching said layer in 1:1 $HCl:H_2O$ solution for approximately one minute;

(k) electroplating gold pad electrode contacts to each segment area where said developed photoresist has been removed;

(l) plasma etching away said undeveloped photoresist with $O_2$;

(m) sputtering Au-Ge, 12% Ge, 88% Au, ohmic contacts on selected areas of the substrate side of said sample;

(n) cleaving the edges of said sample to reduce leakage current; and (o) mounting the sample.

* * * * *